US012154631B2

(12) United States Patent
Liu

(10) Patent No.: US 12,154,631 B2
(45) Date of Patent: Nov. 26, 2024

(54) MEMORY-CONTROL CIRCUIT AND METHOD FOR CONTROLLING ERASING OPERATION OF FLASH MEMORY

(71) Applicant: Nuvoton Technology Corporation, Hsinchu (TW)

(72) Inventor: Tse-Yen Liu, Taipei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 198 days.

(21) Appl. No.: 17/852,597

(22) Filed: Jun. 29, 2022

(65) Prior Publication Data

US 2022/0415405 A1 Dec. 29, 2022

(30) Foreign Application Priority Data

Jun. 29, 2021 (TW) .................................. 110123697

(51) Int. Cl.
  *G11C 16/16* (2006.01)
  *G11C 16/22* (2006.01)
  *G11C 16/26* (2006.01)
  *G11C 16/32* (2006.01)
(52) U.S. Cl.
  CPC .............. *G11C 16/16* (2013.01); *G11C 16/22* (2013.01); *G11C 16/26* (2013.01); *G11C 16/32* (2013.01)
(58) Field of Classification Search
  CPC ......... G11C 16/16; G11C 16/22; G11C 16/26; G11C 16/32; G11C 16/14; G11C 16/34; G06F 13/1668; G06F 13/24; G06F 3/0652; G06F 3/0679
  See application file for complete search history.

(56) References Cited

U.S. PATENT DOCUMENTS

2010/0290292 A1* 11/2010 Tanizaki ................ G11C 16/10
  365/185.11

FOREIGN PATENT DOCUMENTS

JP          0376285 A2 *  7/1990

* cited by examiner

*Primary Examiner* — Jay W. Radke
(74) *Attorney, Agent, or Firm* — MUNCY, GEISSLER, OLDS & LOWE, P.C.

(57) ABSTRACT

A memory-control circuit for use in an integrated circuit is provided. The memory-control circuit includes a memory controller and a timer circuit. The memory controller performs an erase operation on a target data block of the flash memory according to an erase command from a processor, and generates an erase signal. The timer circuit starts a counting operation in response to the erase signal. In response to an intellectual-property-core circuit generating an interrupt signal, the memory controller and the timer circuit respectively suspend the erase operation and the counting operation. In response to the interrupt signal being cleared, the memory controller and the timer circuit respectively resume the erase operation and the counting operation. In response to the timer circuit having counted up to a predetermined value, the timer circuit outputs a completion signal to the memory controller to indicate that the erase operation is complete.

10 Claims, 4 Drawing Sheets

MEMORY-CONTROL CIRCUIT AND METHOD FOR CONTROLLING ERASING OPERATION OF FLASH MEMORY

CROSS REFERENCE TO RELATED APPLICATIONS

This application claims priority of Taiwan Patent Application No. 110123697, filed on Jun. 29, 2021, the entirety of which is incorporated by reference herein.

BACKGROUND OF THE INVENTION

Field of the Invention

The present invention relates to integrated circuits, and, in particular, to a memory-control circuit and a method for controlling an erasing operation of a flash memory.

Description of the Related Art

Conventionally, a flash memory can no longer receive other commands after it has received an erase command and has begun the erase operation, which can take a long time. Therefore, the processor in a conventional integrated circuit needs to wait for the erase operation of the flash memory to be completed before reading data from the storage space of the flash memory. Even if the processor receives an interrupt signal from other circuits during the erase operation of the flash memory, the processor will delay the occurrence of the interrupt signal until the erase operation of the flash memory is completed in order to ensure that the data in the flash memory can be erased correctly. However, the long erase-operation time of the flash memory may affect how quickly the processor can respond to the interrupt signal, thereby reducing the performance of the integrated circuit.

Accordingly, there is demand for a memory-control circuit and a method for controlling an erase operation of a flash memory.

BRIEF SUMMARY OF THE INVENTION

In an exemplary embodiment, a memory-control circuit for use in an integrated circuit is provided. The integrated circuit includes a processor, an intellectual-property-core (IP-core) circuit, and a flash memory. The memory-control circuit includes a memory controller and a timer circuit. The memory controller performs an erase operation on a target data block of the flash memory according to an erase command from a processor, and generates an erase signal. The timer circuit starts a counting operation in response to the erase signal. In response to an intellectual-property-core circuit enabling an interrupt signal, the memory controller and the timer circuit suspend the erase operation and the counting operation, respectively. In response to the interrupt signal being cleared (disabled), the memory controller and the timer circuit resume the erase operation and the counting operation, respectively. In response to the timer circuit having counted up to a predetermined value, the timer circuit outputs an enabled completion signal to the memory controller to indicate that the erase operation is complete.

In some embodiments, the IP-core circuit enables the interrupt signal in response to an interrupt event, and when the processor has completed handling the interrupt signal, the processor transmits an interrupt-clear signal to the IP-core circuit to clear the interrupt signal.

In some embodiments, when the erase operation is erasing a specific page of the target data block and the memory controller suspends the erase operation in response to the interrupt signal, the memory controller sets a page number of the specific page as a break point. In response to the interrupt signal being cleared, the memory controller resumes the erase operation from the break point.

In some embodiments, the timer circuit includes an inverter, an AND gate, a counter, and a comparator. The inverter converts the interrupt signal into an inverted interrupt signal. The AND gate performs an AND operation on the inverted interrupt signal and the erase signal to generate an enable signal. The counter starts counting according to the enable signal to generate a count value. The comparator compares the count value with a predetermined value, and generates the completion signal according to a comparison result.

In some embodiments, in response to the count value being greater than or equal to the predetermined value, the completion signal generated by the comparator is in a high-logic state (enabled state). In response to the count value being lower than the predetermined value, the completion signal generated by the comparator is in a low-logic state (disabled state). In response to the completion signal being in the high-logic state, the counter resets the count value.

In another exemplary embodiment, a method for controlling an erase operation of a flash memory, for use in an integrated circuit, is provided. The integrated circuit comprises a processor, an intellectual-property-core (IP-core) circuit, a memory-control circuit, and a flash memory. The memory-control circuit comprises a memory controller and a timer circuit. The method includes the following steps: utilizing the memory controller to perform an erase operation on a target data block of the flash memory according to an erase command from the processor, and to generate an erase signal; utilizing the timer circuit to start a counting operation in response to the erase signal; in response to the IP-core circuit generating an interrupt signal, utilizing the memory controller and the timer circuit to suspend the erase operation and the counting operation, respectively; in response to the interrupt signal of the IP-core circuit being cleared, utilizing the memory controller and the timer circuit to resume the erase operation and the counting operation, respectively; and in response to the timer circuit having counted up to a predetermined value, utilizing the timer circuit to output a completion signal to the memory controller to indicate that the erase operation is complete.

In some embodiments, the IP-core circuit enables the interrupt signal in response to an interrupt event, and the method further includes the following step: when the processor has completed handling the interrupt signal, utilizing the processor to transmit an interrupt-clear signal to the IP-core circuit to clear the interrupt signal.

In some embodiments, the method further includes the following steps: when the erase operation is erasing a specific page of the target data block and the memory suspends the erase operation in response to the interrupt signal, utilizing the memory controller to set a page number of the specific page as a break point; and in response to the interrupt signal being cleared, utilizing the memory controller to resume the erase operation from the break point.

In some embodiments, the method further includes the following steps: converting the interrupt signal into an inverted interrupt signal; performing an AND operation on the inverted interrupt signal and the erase signal to generate an enable signal; starting counting to generate a count value according to the enable signal; comparing the count value with a predetermined value, and generating the completion signal according to a comparison result.

In some embodiments, the method further includes the following steps: in response to the count value being greater than or equal to the predetermined value, generating the completion signal in a high-logic state (enabled state); in response to the count value being lower than the predetermined value, generating the completion signal in a low-logic state (disabled state); and in response to the completion signal being in the high-logic state, resetting the count value.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
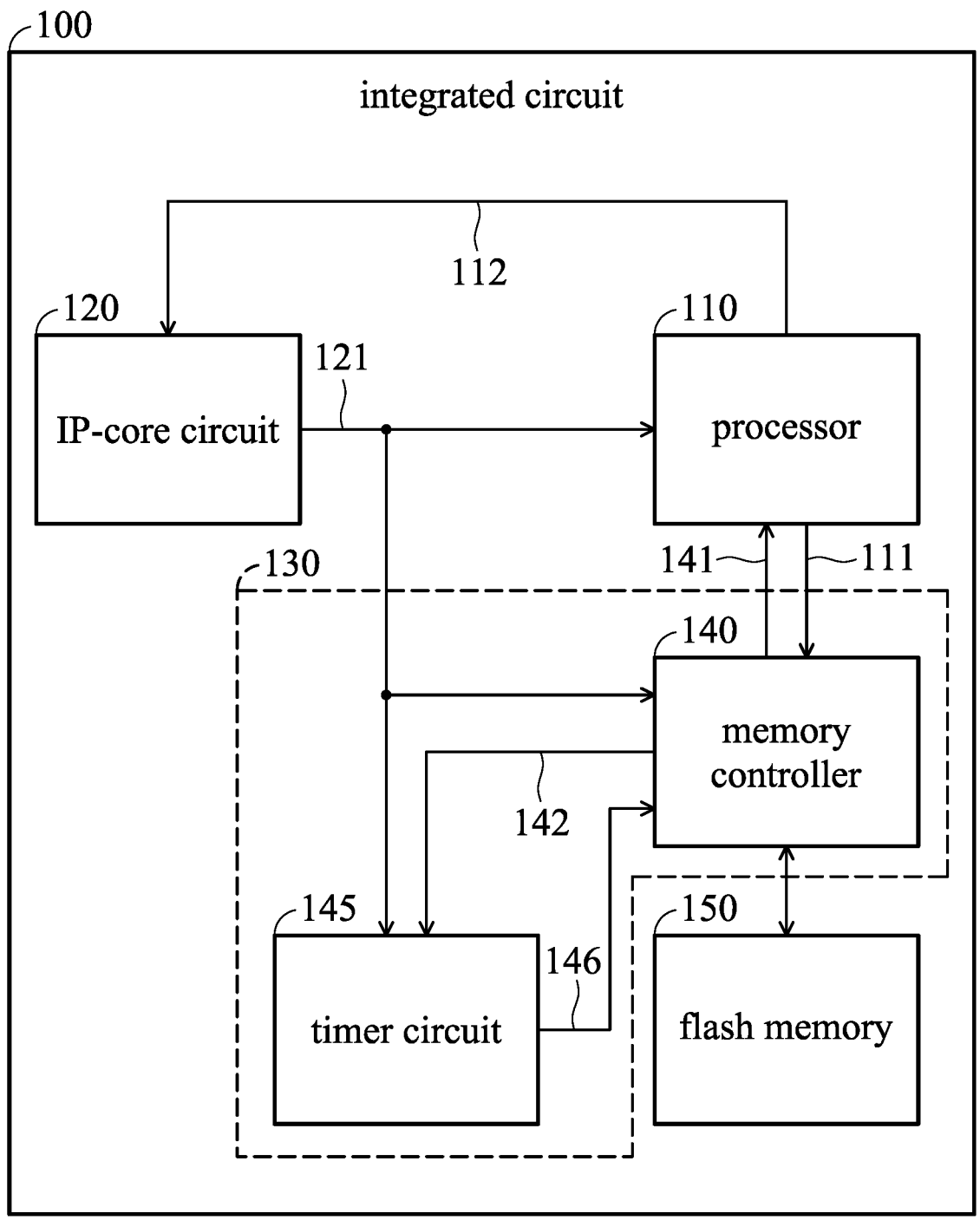
FIG. 1 is a block diagram of an integrated circuit in accordance with an embodiment of the invention.

FIG. 1 is a block diagram of an integrated circuit in accordance with an embodiment of the invention.

In an embodiment, the integrated circuit 100 may include a processor 110, one or more intellectual-property-core (IP-core) circuits 120, a memory-control circuit 130, and a flash memory 150. For example, the processor 110 may be a central processing unit (CPU), a general-purpose processor, or a microprocessor, but the invention is not limited thereto. The processor 110, for example, may send a host command 111 (e.g., a read command, a write command, or an erase command) to the memory-control circuit 130, thereby accessing or erasing data in one or more blocks of the flash memory.

In the field of electronic circuit design, the IP-core circuit 120 may be a reusable unit of logic circuits or integrated circuit layout design. When an interrupt event occurs in the IP-core circuit 120, the IP-core circuit 120 sends an enabled interrupt signal 121 to the processor 110, and the interrupt signal maintains the same logic state (e.g., a high-logic state) until the processor 110 sends an interrupt-clear signal 112 to the IP-core circuit 120, thereby notifying the IP-core circuit 120 that the interrupt event has been handled. At this time, the IP-core circuit 120 may change the logic state of the interrupt signal 121 (e.g., change to a low-logic state) to indicate that there is no interrupt event to be handled.

The memory-control circuit 130 may include a memory controller 140 and a timer circuit 145, wherein the memory controller 140 may control read operations, write operations, and erase operations of the flash memory 150. When an interrupt event occurs in the IP-core circuit 120, the IP-core circuit not only transmits the enabled interrupt signal 121 to the processor 110, but also transmits the enabled interrupt signal 121 to the timer circuit 145 and the memory controller 140 at the same time. The timer circuit 145 starts counting according to an erase signal 142 (e.g., counting the number of clock cycles of the system clock signal of the integrated circuit 100), and suspends counting according to the interrupt signal 121 from the IP-core circuit 120. When the count value of the timer circuit 145 reaches a predetermined value, the timer circuit 145 stops counting, clears the count value, and transmits an enabled completion signal to the memory controller 140. The memory controller 140 may interrupt the current erase operation according to the interrupt signal from the IP-core circuit 120.

It should be noted that, in some cases, the memory controller 140 may perform an erase operation on one or more data blocks in the flash memory, such as when receiving a data-deletion command from the processor, or performing garbage-collection processing to obtain spare blocks. For example, if the memory controller 140 performs an erase operation on a single data block of the flash memory 150, the erase operation usually takes a fixed time, such as 50 milliseconds (not limited).

During the period when the memory controller 140 is normally performing the erase operation, the memory controller 140 will set a busy signal 141 to a high-logic state, thereby allowing the processor to suspend sending host commands to the memory controller 140. When the processor 110 receives the enabled interrupt signal from the IP-core circuit 120 during the erase operation, the processor 110 may preferably executes an interrupt-handling process to handle the interrupt event of the IP-core circuit 120. At the same time, the memory controller 140 and the timer circuit 145 also receive the interrupt signal 121 from the IP-core circuit 120.

When the interrupt signal 121 is in the high-logic state, the memory controller 140 may suspend the erase operation, and set the busy signal 141 to the low-logic state so as to allow the processor 110 to preferably send the host command required by the interrupt-handling process to the memory controller 140 to access data of the flash memory 150. At this time, since the interrupt signal 121 is in the high-logic state, the timer circuit 145 suspends the counting operation.

After the processor 110 completes the interrupt-handling process, the processor 110 may send an interrupt-clear signal 112 to clear the interrupt signal 121 of the IP-core circuit 120, which means to notify the IP-core circuit 120 to set the interrupt signal 121 to the low-logic state. In response to the interrupt-signal 121 being in the low-logic state, the timer circuit 145 resumes the counting operation from the previously suspended count value, and the memory controller 140 resumes the erase operation.

For example, the memory controller 140 may sequentially erase each page in the target data block. When the memory controller 140 suspends the erase operation in response to the interrupt signal 121, the erase operation may be erasing a specific page in the target data block, and the memory controller 140 may stop erasing the specific page and set the page number of the specific page as a break point. When the interrupt signal 121 is cleared, the memory controller 140 can continue to perform the erase operation on the specific page corresponding to the break point.

It should be noted that, during the same erase operation, the IP-core circuit 120 may send one or more enabled interrupt signals 121 to the processor 110, memory controller 140, and timer circuit 145. Whenever the processor 110, memory controller 140, and timer circuit 145 receives the enabled interrupt signal 121 from the IP-core circuit 120, the processor 110, memory controller 140, and timer circuit 145 may respectively perform the interrupt-handling process, suspend the erase operation, and suspend counting according to the aforementioned methods.

For the timer circuit 145, no matter how many times the counting operation of the timing circuit 145 is suspended, the timer circuit 145 stops counting until the count value reaches a predetermined value. Then, the timer circuit 145 sends the completion signal 146 to the memory controller 140, and reset the count value to the initial value (e.g., 0). Accordingly, the predetermined value, which indicates the number of clock cycles of the system clock signal, can be converted into a corresponding time length, which is the fixed time spent on the erase operation.

Figure 2:
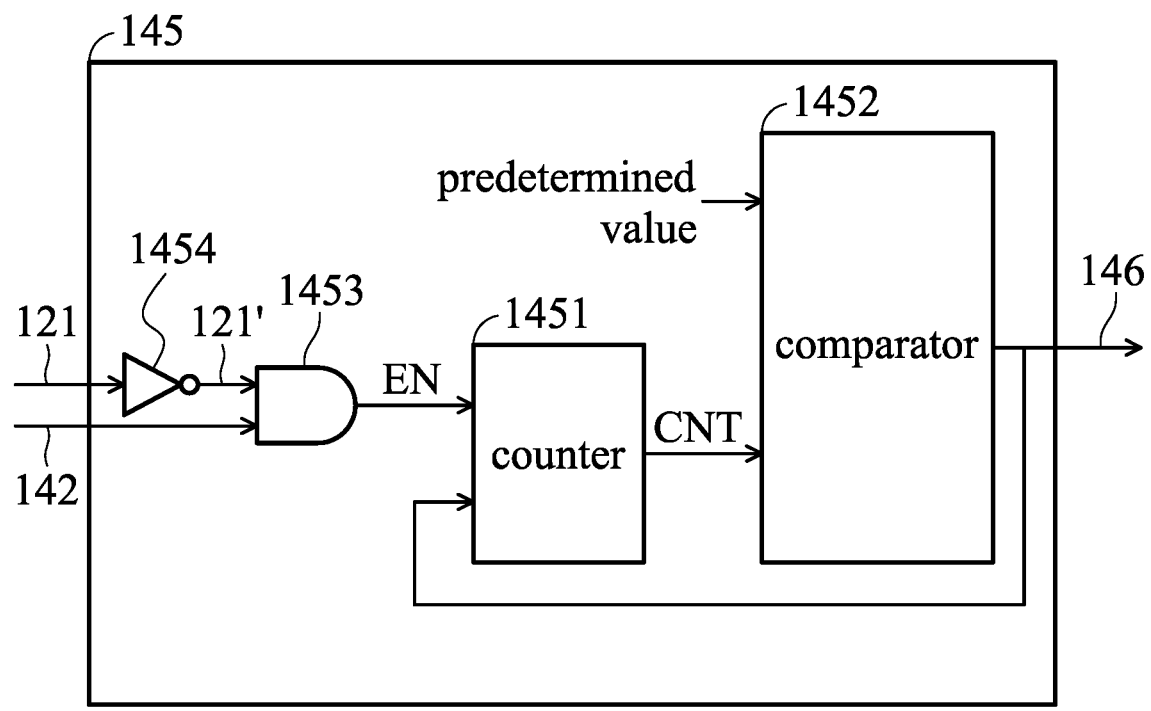
FIG. 2 is a block diagram of the timer circuit in accordance with the embodiment of FIG. 1.

FIG. 2 is a block diagram of the timer circuit in accordance with the embodiment of FIG. 1.

As shown in FIG. 2, the timer circuit 145 may include a counter 1451, a comparator 1452, an AND gate 1453, and an inverter 1454. The interrupt signal 121 is passed through the inverter 1454 to obtain the inverted interrupt signal 121', and the inverted interrupt signal 121' is input to one input terminal of the AND gate 1453. The erase signal 142 output by the memory controller 140 is input to the other input terminal of the AND gate 1453. The inverted interrupt signal 121' and the erase signal logically combined by the AND gate 1453 to generate an enable signal EN, wherein the enable signal EN is used to control the counting operation of the counter 1451. For example, when the enable signal EN is in the high-logic state, the counter 1451 will continue to count. When the enable signal EN is in the low-logic state, the counter 1451 will suspend the counting operation. The counter 1451 outputs the current count value CNT to one input terminal of the comparator 1452. The comparator 1452 compares the count value CNT with a predetermined value, wherein the predetermined value can be from a register (not shown). For example, the predetermined value can be loaded into the register by the processor 110 when the power to the integrated circuit 100 is turned on.

When the interrupt signal 121 is in the low-logic state, it means that no interrupt event occurs in the IP core circuit, and the inverted interrupt signal 121' is in the high-logic state. When the erase signal 142 is in the low-logic state and the inverted interrupt signal 121' is in the high-logic state, it means that the memory controller 140 is not currently performing an erase operation, and the enable signal EN generated by the AND gate 1453 is in the low-logic state, so the counter 1451 will stop the counting operation. When the erase signal 142 and the inverted interrupt signal 121' are both in the high-logic state, the enable signal EN output by the AND gate 1453 is in the high-logic state. At this time, the counter 1451 will continue the counting operation, and output the count value CNT to the comparator 1452.

When the interrupt signal 121 is in the high-logic state, it means that an interrupt event occurs in the IP-core 120, and the inverted interrupt signal 121' is in the low-logic state. At this time, no matter what logic state the erase signal 142 is, the enable signal EN output by the AND gate 1453 is in the low-logic state, which means that the counter 1451 will stop the counting operation.

When the count value CNT is less than the predetermined value, the completion signal 146 output by the comparator 1452 is in the low-logic state, which means that the accumulated execution time of the current erase operation has not reached the predetermined time, and the counter 1451 will continue counting when the enable signal EN is in the high-logic state. When the counter value CNT is greater than or equal to the predetermined value, the completion signal 146 output by the comparator 1452 is in the high-logic state, which means the accumulated execution time of the current erase operation has reached the predetermined time (e.g., 50 ms, but not limited), and the completion signal 146 output by the comparator 1452 is output to the memory controller 140. At this time, in response to the completion signal being in the high-logic state, the memory controller 140 can continue to perform the next erase operation.

Figure 3:
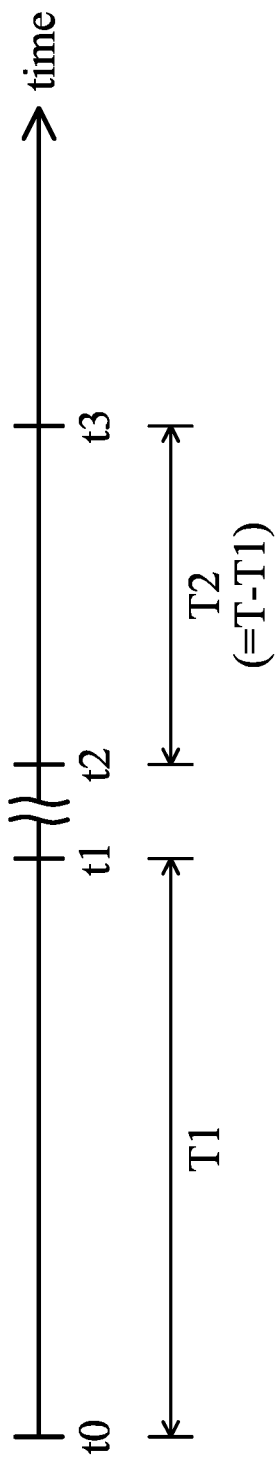
FIG. 3 is a diagram of the period of an erase operation and an interrupt event in accordance with an embodiment of the invention.

FIG. 3 is a diagram of the period of an erase operation and an interrupt event in accordance with an embodiment of the invention. Please refer to FIG. 1 and FIG. 3.

In the embodiment of FIG. 3, it is assumed that the memory controller 140 needs a time period T to perform an erase operation. At time t0, the memory controller starts to perform the erase operation and sends the erase signal 142 to the timer circuit 145, so the counter 1451 of the timer circuit 145 starts counting. When the time length T1 elapses (i.e., at time t1), an interrupt event occurs in the IP-core circuit 120, and the interrupt signal sent by the IP-core circuit 120 will be in the high-logic state. Accordingly, the enable signal EN generated by the AND gate 1453 of the timer circuit 145 is in the low-logic state, so the counter 1451 will stop the counting operation.

At time t2, when the processor 110 has completed handling the interrupt event in the IP-core circuit 120, the processor 110 will send an interrupt-clear signal 112 to the IP-core circuit 120 to clear the interrupt signal 121, so at this time the interrupt signal 121 sent by the IP-core circuit 120 is in the low-logic state. Accordingly, the enable signal EN generated by the AND gate 1453 of the timer circuit 145 is in the high-logic state, and the erase signal 142 is also in the high-logic state, so the counter 1451 will resume the counting operation at time t2. That is, the elapsed time of the erase operation performed by the memory controller 140 will continue to count from the time length T1.

When the elapsed time of the erasing operation passes the time length T2 and accumulates to the time length T (e.g., at time t3), it indicates that the count value CNT of the counter 1451 has reached the predetermined value, so the completion signal 146 generated by the comparator 1452 will be in the high-logic state. Accordingly, in response to the completion signal being in the high-logic state, the counter will reset the count value CNT. To sum up, the time of the erase operation in the present invention is a total accumulation of time T1+T2. When the memory controller 140 performs erasing in the second erase operation time during the period of performing the overall erase operation (i.e., including the first erase operation time and second erase operation time), the time length T2 of the second erase operation can be calculated by subtracting the time length T1, that has been performed for the first erase operation, from the time length T of the overall erase operation, that is, T2=T−T1. Thus, when the memory controller 140 resumes the erase operation after the interrupt event is cleared, it is not necessary to perform a complete new erase operation again, and the erase operation can be continued from the break point of the erase operation, so the total erasing time of the flash memory 150 can be shortened, and the operation performance of the integrated circuit 100 can be improved.

It should be noted that, during the period of the same erase operation, the number of times the counting operation is suspended by the interrupt signal is not limited in the present invention. As long as the memory controller 140 is in the state of executing the erasing operation, the memory-control circuit 130 may monitor whether an interrupt signal occurs in the integrated circuit at any time, and can stop the erase operation of the flash memory 150 and the counting operation of the timer circuit 145 at any time while performing the erase operation.

In some embodiments, the erasing in the second erase operation time during the overall erase operation performed by the memory controller 140 can be achieved in two ways, for example: (1) using the processor to send an erase command of the flash memory 150; or (2) using the memory controller 140 to automatically issue an erase command of the flash memory after the interrupt signal is cleared. In the first way, a high degree of freedom of operation can be provided. In the second way, the erase command can be automatically executed by the hardware circuit to avoid the problem of incomplete clearing of the flash memory 150 due to negligent operation of the software.

Figure 4:
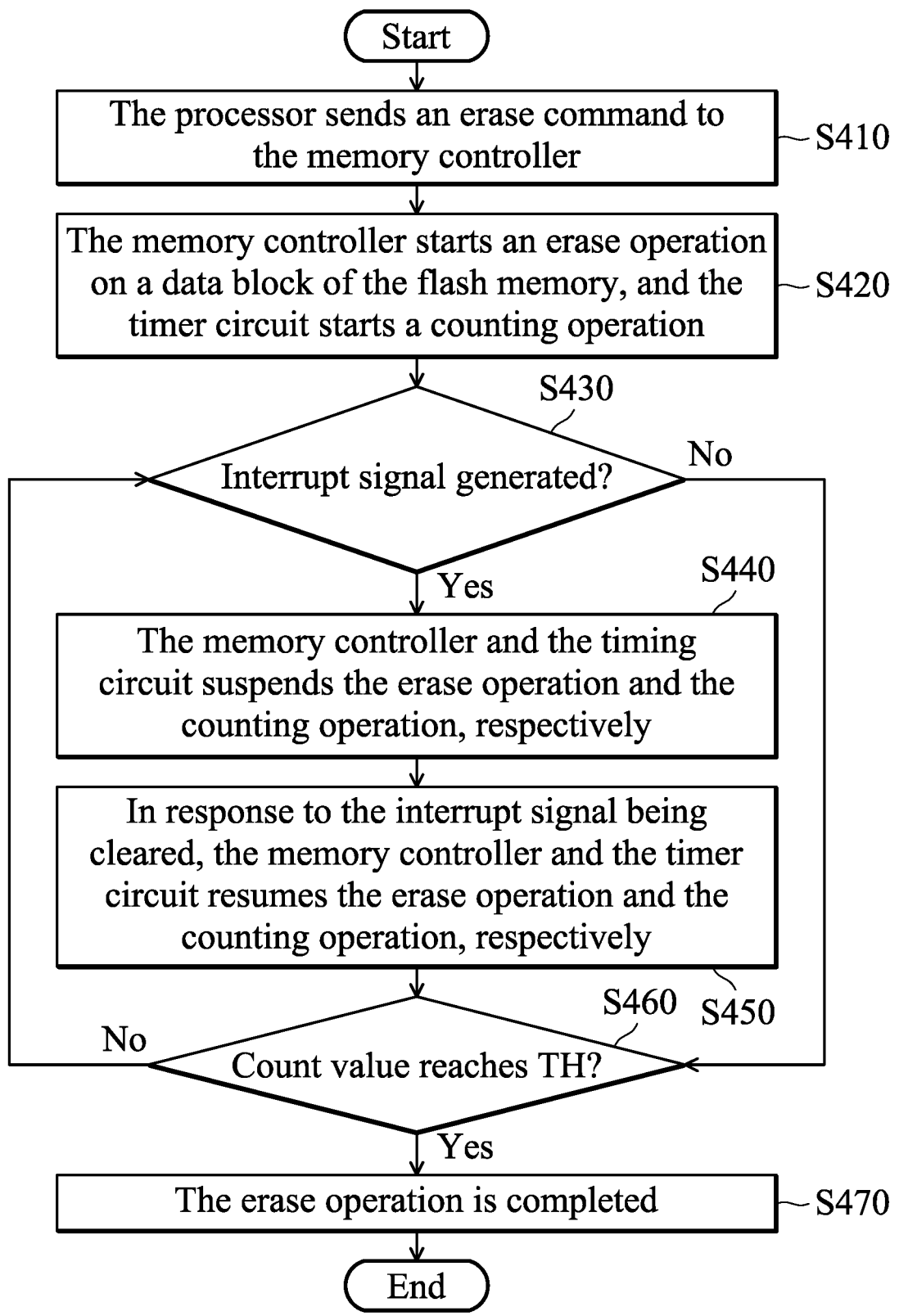
FIG. 4 is a method for controlling an erase operation of the flash memory in accordance with an embodiment of the invention.

FIG. 4 is a method for controlling an erase operation of the flash memory in accordance with an embodiment of the invention. Please refer to FIG. 1, FIG. 2, and FIG. 4.

In step S410, the processor 110 sends an erase command to the memory controller 140.

In step S420, the memory controller 140 starts an erase operation on a data block of the flash memory, and the timer circuit 145 starts a counting operation. For example, when the memory controller 140 starts to perform the erase operation, the memory controller 140 also transmits the erase signal 142 (e.g., in the high-logic state) to the counter 1452 of the timing circuit 145 at the same time. In response to the erase signal 142, the counter 1451 starts the counting operation, such as counting the number of elapsed system clock cycles.

In step S430, it is determined whether the IP-core circuit 120 generates an interrupt signal. If the IP-core circuit 120 generates an interrupt signal, step S440 is performed. If the IP-core circuit 120 does not generate an interrupt signal, step S460 is performed. For example, when an interrupt event occurs in the IP-core circuit 120, the IP-core circuit 120 will send the interrupt signal 121 to the processor 110, and the interrupt signal 121 mains at the same logic state (e.g., high-logic state) until the processor 110 sends the interrupt-clear signal 112 to the IP-core circuit 120, thereby notifying the IP-core circuit 120 that the interrupt event has been handled. At this time, the IP-core circuit 120 may change the logic state of the interrupt signal (e.g., change to the low-logic state) to indicate that there is no interrupt event to be handled.

In step S440, the memory controller 140 and the timing circuit 145 suspends the erase operation and the counting operation, respectively, and the processor 110 processes the interrupt event corresponding to the interrupt signal. For example, when the interrupt signal 121 is in the high-logic state, the enable signal EN generated by the AND gate 1453 in FIG. 2 is in the low-logic state, so the counter 1451 of the timer circuit 145 will stop the counting operation.

In step S450, in response to the interrupt signal being cleared, the memory controller 140 and the timer circuit 145 resumes the erase operation and the counting operation, respectively. For example, after the processor 110 has completed the interrupt-handling process, the processor 110 sends the interrupt-clear signal 112 to clear the interrupt signal 121 of the IP-core circuit 120, which means to notify the IP-core circuit 120 to set the interrupt signal 121 to be in the low-logic state. In response to the interrupt signal being in the low-logic state, the timer circuit 145 resumes the counting operation from the previously interrupted count value, and the memory controller 140 resumes the erase operation.

In step S460, it is determined whether a count value of the timer circuit 145 has reached a predetermined value TH. If the count value of the timer circuit 145 has reached the predetermined value TH, step S470 is performed. If the counter value of the timer circuit 145 has not reached the predetermined value TH yet, the flow goes back to step S430. For example, the comparator 1452 of the timer circuit 145 may compare the count value CNT of the counter 1451 with the predetermined value TH. When the count value CNT of the counter 1451 is less than the predetermined value, the completion signal 146 output by the comparator 1452 is in the low-logic state, which means that the accumulated execution time of the current erase operation has not reached the predetermined time, and the counter 1451 will continue the counting operation when the enable signal EN is in the high-logic state.

In step S470, the erase operation is completed. For example, when the count value CNT is greater than or equal to the predetermined value TH, the completion signal 146 output by the comparator 1452 is in the high-logic state, which means that the accumulated execution time of the current erase operation has reached the predetermined time (e.g., 50 ms, but not limited). At this time, in response to the completion signal 146 being in the high-logic state, the memory controller 140 can continue to perform the next erase operation.

In view of the above, a memory-control circuit and a method for controlling an erase operation of the flash memory are provided, which allow the memory controller to resume the erase operation after the interrupt event is cleared without performing a complete new erase operation, and the erase operation can be resumed from the break point of the original erase operation, so the total erase time of the flash memory can be shortened, thereby improving the operation performance of the integrated circuit.

The use of words such as "first", "second" and "third" in the scope of the patent application are used to modify the elements in the scope of the patent application, and are not used to indicate that there is an order of priority between them, a precedence relationship, either one element precedes another, or the chronological order in which method steps are performed, used only to distinguish elements with the same name.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory-control circuit, for use in an integrated circuit, wherein the integrated circuit comprises a processor, an intellectual-property-core (IP-core) circuit, and a flash memory, the memory-control circuit comprising:

a memory controller, configured to perform an erase operation on a target data block of the flash memory according to an erase command from the processor, and to generate an erase signal; and a timer circuit, configured to start a counting operation in response to the erase signal, wherein in response to the IP-core circuit generating an enabled interrupt signal, the memory controller and the timer circuit respectively suspend the erase operation and the counting operation, wherein in response to the enabled interrupt signal from the IP-core circuit being cleared, the memory controller and the timer circuit respectively resume the erase operation and the counting operation, and wherein in response to the timer circuit having counted up to a predetermined value, the timer circuit outputs a completion signal to the memory controller to indicate that the erase operation is complete.

2. The memory-control circuit as claimed in claim 1, wherein the IP-core circuit generates the enabled interrupt signal in response to an interrupt event, and when the processor has completed handling the enabled interrupt signal, the processor transmits an interrupt-clear signal to the IP-core circuit to clear the enabled interrupt signal.

3. The memory-control circuit as claimed in claim 1, wherein when the erase operation is erasing a specific page of the target data block and the memory controller suspends the erase operation in response to the enabled interrupt signal, the memory controller sets a page number of the specific page as a break point, wherein in response to the enabled interrupt signal being cleared, the memory controller resumes the erase operation from the break point.

4. The memory-control circuit as claimed in claim 1, wherein the timer circuit comprises:

an inverter, converting the enabled interrupt signal into an inverted interrupt signal;

an AND gate, performing an AND operation on the inverted interrupt signal and the erase signal to generate an enable signal;

a counter, starting counting to generate a count value according to the enable signal; and a comparator, comparing the count value to the predetermined value, and generating the completion signal according to a comparison result.

5. The memory-control circuit as claimed in claim 4, wherein:

in response to the count value being greater than or equal to the predetermined value, the completion signal generated by the comparator is in a high-logic state;

in response to the count value being lower than the predetermined value, the completion signal generated by the comparator is in a low-logic state; and in response to the completion signal being in the high-logic state, the counter resets the count value.

6. A method for controlling an erase operation of a flash memory, for use in an integrated circuit, wherein the integrated circuit comprises a processor, an intellectual-property-core (IP-core) circuit, a memory-control circuit, and a flash memory, and the memory-control circuit comprises a memory controller and a timer circuit, the method comprising:

utilizing the memory controller to perform an erase operation on a target data block of the flash memory according to an erase command from the processor, and to generate an erase signal;

utilizing the timer circuit to start a counting operation in response to the erase signal;

in response to the IP-core circuit generating an enabled interrupt signal, utilizing the memory controller and the timer circuit to suspend the erase operation and the counting operation, respectively;

in response to the enabled interrupt signal from the IP-core circuit being cleared, utilizing the memory controller and the timer circuit to resume the erase operation and the counting operation, respectively; and wherein in response to the timer circuit having counted up to a predetermined value, utilizing the timer circuit to output a completion signal to the memory controller to indicate that the erase operation is complete.

7. The method as claimed in claim 6, wherein the IP-core circuit generates the enabled interrupt signal in response to an interrupt event, and the method further comprises:

when the processor has completed handling the enabled interrupt signal, utilizing the processor to transmit an interrupt-clear signal to the IP-core circuit to clear the enabled interrupt signal.

8. The method as claimed in claim 6, further comprising:

when the erase operation is erasing a specific page of the target data block and the memory suspends the erase operation in response to the enabled interrupt signal, utilizing the memory controller to set a page number of the specific page as a break point; and in response to the enabled interrupt signal being cleared, utilizing the memory controller to resume the erase operation from the break point.

9. The method as claimed in claim 6, further comprising:

converting the enabled interrupt signal into an inverted interrupt signal;

performing an AND operation on the inverted interrupt signal and the erase signal to generate an enable signal;

starting counting to generate a count value according to the enable signal;

comparing the count value to the predetermined value, and generating the completion signal according to a comparison result.

10. The method as claimed in claim 9, further comprising:

in response to the count value being greater than or equal to the predetermined value, generating the completion signal in a high-logic state;

in response to the count value being lower than the predetermined value, generating the completion signal in a low-logic state; and in response to the completion signal being in the high-logic state, resetting the count value.

\* \* \* \* \*